Nov. 14, 1961 B. W. LEE 3,009,069

MONOSTABLE CIRCUITS

Filed April 23, 1957 2 Sheets-Sheet 1

INVENTOR
B. W. LEE
BY
Harold C. Herman
ATTORNEY

Nov. 14, 1961 B. W. LEE 3,009,069

MONOSTABLE CIRCUITS

Filed April 23, 1957 2 Sheets-Sheet 2

INVENTOR
B.W. LEE
BY
Harold C Herman
ATTORNEY 3,009,069
Patented Nov. 14, 1961

3,009,069
MONOSTABLE CIRCUITS

Bock W. Lee, New York, N.Y., assignor to Bell Telephone Laboratories, Incorporated, New York, N.Y., a corporation of New York Filed Apr. 23, 1957, Ser. No. 654,603
4 Claims. (Cl. 307—88.5)

This invention relates to semiconductor signal translating devices and more particularly to monostable circuits including transistors.

A monostable circuit is one which has one equilibrium condition to which it returns after being shifted, displaced, or triggered therefrom. Devices such as transistors which have a current amplification factor greater than one lend themselves to monostable circuit applications. The current amplification factor, or alpha, of a transistor is the ratio of its collector current to its emitter curent. By connecting a relatively large impedance to the base electrode of a transistor which has a current amplification factor greater than one, an input transistor characteristic having a negative resistance region is obtained. Such circuits which have a transistor and a base impedance are disclosed, for example, in Patent 2,629,833 granted to R. L. Trent on February 24, 1953.

Two recognized classes of transistors are the point contact transistor, of which those disclosed in Patent 2,524,035 granted October 3, 1950, to J. Bardeen and W. H. Brattain are illustrative, and the junction transistor, of which those disclosed in Patent 2,569,347 granted September 25, 1951, to W. Shockley, are illustrative. Point contact transistors have a current amplification factor greater than one and junction transistors have a current amplification factor less than one.

Transistors of both kinds are also classified as to conductivity type with the NPN junction transistor, for example, being of opposite conductivity type as the PNP junction transistor. Two junction transistors of opposite conductivity type may be interconnected to form a combined transistor device which has a current amplification factor greater than one and which can be utilized instead of the point contact transistor in bistable circuit applications. Such combined transistor devices are disclosed, for example, in the Patent 2,655,609 granted to W. Shockley on October 13, 1953.

A general object of this invention is to provide an improved combined translating device having a current amplification factor greater than one so that, together with a base impedance, it may be utilized as a negative resistance element in a monostable circuit.

Another general object of this invention is to obtain novel and improved performance characteristics for circuit elements including transistors.

Still another object of this invention is to provide an improved regenerative pulse amplifier that generates a standardized rectangular pulse upon reception of a mutilated or attenuated pulse.

Still another object of this invention is to provide a combined translating device having a current amplification or gain that is dependent upon time.

A further object of this invention is to provide a combined translating device which controls the pulse duration of a monostable circuit.

Still a further object of this invention is to provide a combined translating device which functions as the energy storage element in a negative resistance circuit.

Still a further object of this invention is to provide a combined translating device which has a steady state current amplification factor less than one and a transient current amplification factor much greater than one.

In accordance with one illustrative embodiment of this invention a pair of junction transistors of opposite conductivity type are interconnected with the base of each connected to the collector of the other. The interconnected junction transistors together with two impedance arrangements are connected as a three-terminal combined device. One terminal is connected to the emitter of one of the transistors, another terminal is connected to the base of the same transistor and the two impedance arrangements connect, respectively, the base and emitter of the other transistor to the third terminal. The three-terminal device, which includes the two impedance arrangements, functions to provide a current amplification factor greater than one when an input pulse is provided thereto.

A feature of this invention relates to the provision of two impedance arrangements connected as part of the combined device. The two impedance arrangements function to control the composite alpha and reduce leakage currents so that the size of the alpha of the junction transistors utilized in the device is not restricted thereby.

Another feature of this invention pertains to the utilization of the combined device as the negative resistance element in a monostable circuit.

A further feature of this invention relates to means in the combined device for decreasing the turn-on interval of the monostable circuit. The impedance connected from the output terminal of the combined device to the base electrode of one of the junction transistors includes an inductor which functions to increase the composite current amplification factor of the device during the turn-on interval. The large transient current amplification results in a relatively short turn-on interval.

Still a further feature of this invention relates to the provision of an energy storage element in the combined device for controlling the pulse duration of the monostable circuit. In one embodiment, the energy storage element is an inductor connected between the base electrode of one of the transistors and the output terminal. In another embodiment, the energy storage element is a capacitor connected between the emitter electrode of one of the transistors and the output terminal. For both embodiments, the current amplification factor of the combined device is high only at the beginning of the input pulse provided to the monostable circuit. The current amplification factor of the combined device may even be less than one during steady state conditions.

Still a further feature of this invention pertains to the provision of a combined device which has a current amplification factor less than one during steady state conditions and which has a large current amplification factor during transient conditions. The energy storage element in the combined device provides for a current amplification factor or gain that is dependent on time.

Further objects and features will become apparent upon consideration of the following description read in conjunction with the drawing wherein.

Figure 2:
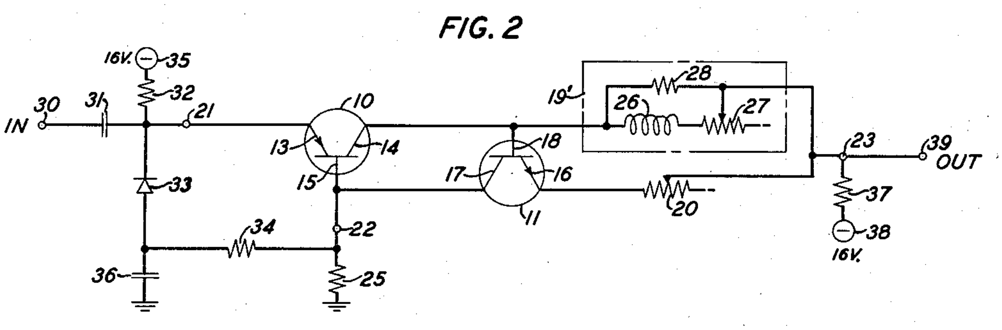
FIG. 2 is a circuit representation of an embodiment of the monostable circuit of this invention.
Figure 3:
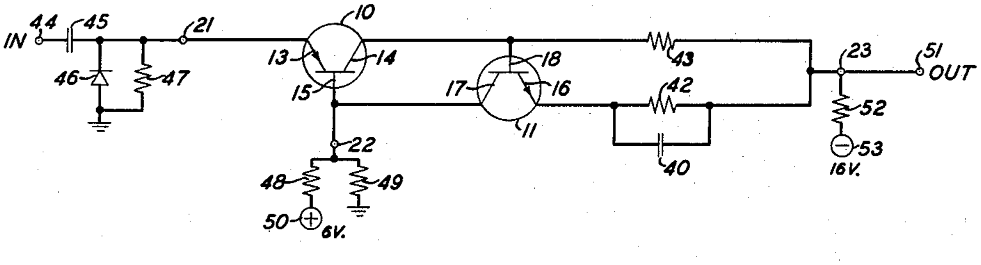
FIG. 3 is a circuit representation of another embodiment of the monostable transistor circuit of this invention.
Figure 5:
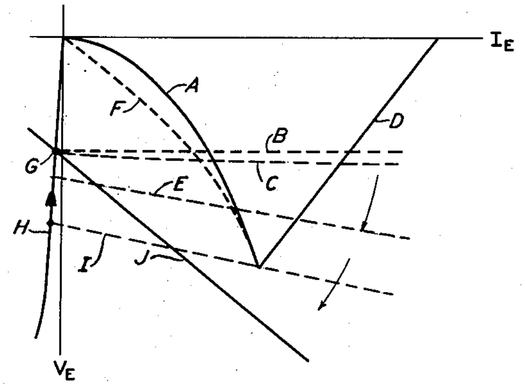
Figure 6:
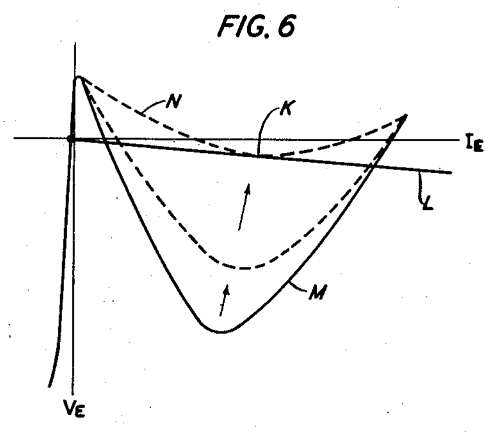
Figure 7:
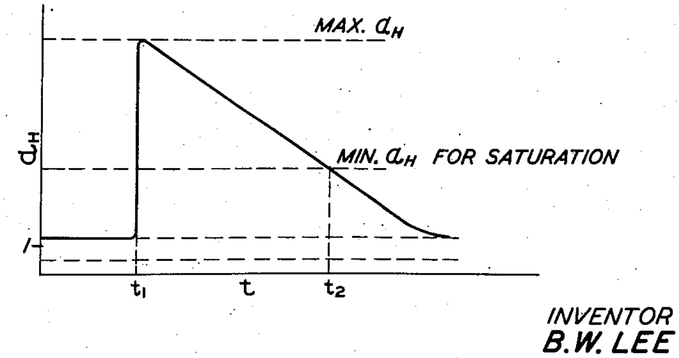

FIG. 5 includes curves illustrating the negative resistance characteristic and emitter load line of the monostable circuit shown in FIG. 2;

FIG. 6 includes curves illustrating the negative resistance characteristic and emitter load line of the monostable circuit shown in FIG. 3; and FIG. 7 is a curve illustrating the variation of the composite current amplification factor of the combined device shown in FIG. 3 when an input pulse is provided thereto.

Figure 1:
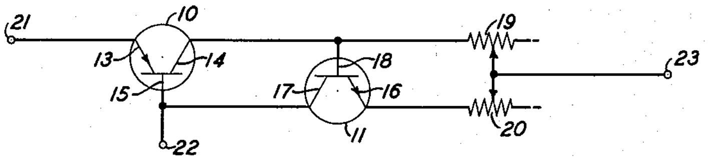
FIG. 1 is a circuit representation of one embodiment of the combined transistor device of this invention.

Referring now to FIG. 1, the three-terminal transistor device comprises a pair of junction transistors 10 and 11 of opposite conductivity type. The transistor 10 is a PNP junction transistor having an emitter 13, a collector 14 and a base 15, and the transistor 11 is an NPN junction transistor having an emitter 16, a collector 17 and a base 18. The two transistors 10 and 11, which advantageously have substantially similar performance characteristics except, of course, for the difference in polarities, are connected between three terminals 21, 22 and 23. The emitter 13 and base 15 of transistor 10 are connected respectively to terminals 21 and 22, and the emitter 16 and base 18 are connected respectively through the rheostats 20 and 19 to the terminal 23.

The terminals 21, 22 and 23 function, respectively, as the emitter, base and collector of the combined transistor device or "hook" connection shown in FIG. 1. Illustrative external circuit connections to the terminals 21, 22 and 23, which are shown in FIG. 2, are hereinafter described. The composite current amplification factor, or ratio, of the device collector current (the current through terminal 23), to the device emitter current (the current through terminal 21), is greater than one even though the inherent current amplification factors of the junction transistors 10 and 11 are less than one. The composite current amplification factor of the combined device shown in FIG. 1 is controlled by the rheostats 19 and 20. If the rheostat 19 is adjusted to present an infinite resistance, or open circuit, and the rheostat 20 is adjusted to present a zero resistance, or short circuit, the emitter 16 of the NPN transistor 11 becomes functionally the collector of the combined device. With the rheostats 19 and 20 so adjusted, they are functionally not present in the combined device. When the rheostats 19 and 20 are so adjusted, the combined device constitutes an equivalent transistor having a composite current amplification factor, alpha, given by the relation $$\text{alpha}=\frac{\text{alpha (10)}}{1-\text{alpha (11)}}$$

where alpha (10) is the current amplification factor of transistor 10 and alpha (11) is the current amplification factor of transistor 11. It is evident that the composite alpha is much greater than either alpha (10) or alpha (11). For example, if both alpha (10) and alpha (11) are equal to 0.9, the composite alpha is equal to 9. The composite alpha becomes larger as the alpha of transistor 11 approaches 1.

With the rheostats 19 and 20 effectively out of the circuit in the manner described above, the total leakage current of the combined device is given by the relation $$\text{total leakage current}=\frac{Ico\ (10)+Ico\ (11)}{1-\text{alpha (11)}}$$

where I*co* (10) and I*co* (11) are, respectively, the leakage currents of the transistors 10 and 11. It is evident, therefore, that the total leakage current would be exceedingly high if the current amplification factor, or alpha, of the transistor 11 approaches 1.

The two characteristics, composite alpha and total leakage current, place limitations on the current amplification factor of transistor 11 when the rheostats 19 and 20 are adjusted in the manner described above to present, respectively, infinite and zero impedances. For monostable circuit applications, the composite alpha should be between 1.6 and 4 and the total leakage current should be less than 1 milliampere. If the composite alpha is much less than 1.6, a monostable circuit, including the combined device, cannot be readily triggered from its equilibrium condition, and if the composite alpha is much greater than 4 the circuit may automatically trigger from its low current equilibrium condition. Monostability, with a low current equilibrium condition is difficult to achieve if the total leakage current exceeds 1 milliampere and the composite current amplification factor is greater than 4. A low current equilibrium condition is difficult to achieve with large leakage currents coupled with large composite alpha because the circuit may automatically trigger or shift to the high current condition. Other undesirable effects of large leakage currents are to increase the output pulse duration, to increase the dissipation in the transistors and associated components, and to decrease the output pulse amplitude.

For these reasons, when the rheostats 19 and 20 are not included in the combined device, the current amplification factor of the transistor 11 must be restricted to a value less than 0.75. The rheostats 19 and 20 function to adjust the composite current amplification factor and to reduce the total leakage current so that the magnitudes of the current amplification factors of the transistors 10 and 11 are not restricted.

The rheostat 9 functions to shunt part of the collector current of transistor 10 around the transistor 11. More specifically the collector current of transistor 10 is provided to a two-branch parallel circuit arrangement, with one branch consisting of the base-to-emitter junction of transistor 11 in series with the rheostat 20 and the other branch consisting of the rheostat 19. The portion of the collector current of transistor 10 that passes through the rheostat 19 is not amplified by the transistor 11. Moreover, a part of the collector current of transistor 11 is shunted through the rheostat 19 instead of being amplified to the emitter 16 of transistor 11. A portion of both the collector current of transistor 10 and the collector current of transistor 11 is, in this manner, shunted from amplification through the transistor 11. The amount of these shunted currents is controlled by the magnitude of the resistance presented by the rheostat 19. The smaller the resistance presented by the rheostat 19 the greater are the shunted currents and the smaller is the composite current amplification factor of the combined device.

This shunting arrangement not only reduces the current amplification factor of the combined device but it also effectively controls the total leakage current of the combined device. A portion of both the leakage current of transistor 10 and of transistor 11 is shunted through the rheostat 19 to the terminal 23 instead of being amplified through the transistor 11 to the terminal 23. When the combined device is in a low current condition the effect of the rheostat 19 on the combined current amplification factor and total leakage current is assisted by the relatively large resistance presented by the emitter junction of transistor 11. In the low current condition the resistance presented by the emitter junction of transistor 11 is high so that a greater percentage of the collector currents of transistors 10 and 11 are shunted through the rheostat 19. When, however, the combined device is in a high current condition, the emitter junction of transistor 11 presents a very low impedance so that a smaller percentage of the collector currents of transistors 10 and 11 are shunted through the rheostat 19. In this manner, the current amplification factor of the combined device is small when the combined device is in a low current condition and it is higher when the combined device is in a high current condition. The high impedance of the emitter junction at low current levels makes the composite current amplification factor of the combined device very nearly equal to the current amplification factor of the PNP transistor 10.

Since the impedance of the emitter junction of transistor 11 is very small at high current levels, the rheostat 19 is shunted by a very small impedance if the rheostat 20 is set to present a short-circuit connection from the emitter 16 to the terminal 23. It is not only necessary to restrict the magnitude of the composite current amplification factor at low current levels, but also at high current levels in order to allow the combined device to readily restore to its low current condition. The rheostat 20 functions to fix the maximum value of the composite current amplification factor at high current levels. The rheostat 20 fixes the maximum current amplification factor because it introduces an impedance in the emitter circuit of transistor 11 which parallels the path through the rheostat 19. Some of the collector currents of the transistors 10 and 11 are therefore shunted through the rheostat 19 at high current levels as well as at low current levels. Even with rheostat 20, the percentage of collector currents that is shunted through the rheostat 19 at high current levels is smaller than the percentage shunted through the rheostat 19 at low current levels because of the change in impedance of the emitter junction of transistor 11.

The rheostat 20, in addition to fixing the maximum of the composite current amplification factor at high current levels, also assists in reducing leakage currents. The added impedance in the emitter circuit of transistor 11 causes a larger percentage of the collector currents of transistors 10 and 11 to pass through the rheostat 19. At relatively high temperatures the impedance presented by the emitter junction of transistor 11 is reduced. The rheostat 20 therefore forms an important function in maintaining reduced leakage currents at relatively high ambient temperatures.

The over-all power dissipation of the combined device is very small because of the small currents passing through the high resistance base circuits of transistors 10 and 11. When the rheostats 19 and 20 are included in the combined device, the dissipation is lower for the low current levels, for the high current levels and also during transients. The dissipation is lower because some of the current which would normally pass through the base 15 or the base 18 is shunted through the rheostat 19.

The combined device shown in FIG. 1 may be utilized in a monostable circuit as shown in FIG. 2. The terminals 21, 22 and 23 in FIG. 2 are the same as the terminals 21, 22 and 23 in FIG. 1. The combined device shown in FIG. 2 between the terminals 21, 22 and 23 is a modification of the combined device described above and shown in FIG. 1. When the combined device shown in FIG. 1 is utilized in the circuit shown in FIG. 2, it provides for a negative resistance characteristic of the type shown in FIG. 5.

The negative characteristic has a low current positive resistance region H, a negative resistance region A, and a high current positive resistance region D. Adjusting the rheostats 19 and 20 varies the negative resistance region A. The circuit shown in FIG. 2 has one equilibrium condition at point G in the low current positive resistance region H. The point G is on the emitter load line J which intersects the negative resistance characteristic at point G. The negative resistance characteristic differs from the ordinary negative resistance characteristic provided by a transistor device because the low emitter current portion of the region A is relatively horizontal. The negative resistance region A is relatively horizontal for low emitter currents because the combined device has a very low current amplification factor, as described above, at low current levels. The effect of the low current amplification factor at low current levels, or of the horizontal portion of the characteristic, is a small degradation of turn-on or trigger sensitivity. As is hereinafter described, the utlizing of an inductive impedance arrangement 19' instead of the rheostat 19 as the shunting path for the collector currents of the transistors 10 and 11 compensates for the small degradation of trigger sensitivity, and provides for a negative resistance region shown by the dotted curve F and the lower end of region A.

The combined device shown in FIG. 2 is similar to the device shown in FIG. 1 except that a variable circuit arrangement 19' is substituted for the rheostat 19. The base electrode 18 of transistor 11 is connected through the inductor 26 and the rheostat 27 to the terminal 23, and the serially connected inductor 26 and resistor 27 are shunted by the resistor 28. The inductor 26 improves the trigger sensitivity by making the composite amplification factor relatively high during the urn-on transient. During the transient, the inductor 26 presents a high impedance so that a much higher percentage of the collector currents of transistors 10 and 11 are amplified through the transistor 11, and a smaller input current is required to trigger the circuit. When the transient terminates, the inductor 26 again presents a low impedance to allow a larger percentage of the collector currents to be shunted away from the transistor 11. In this manner, the inductor 26 functions to increase the composite alpha of the device during the triggering transient, thereby reducing the turn-on interval. It is important to have the current amplification factor of the combined device relatively high during the triggering transient to reduce the interval for triggering the combined device from its low current equilibrium condition. The resistor 28 serves the dual purpose of dissipating the transients set up in the inductor 26 and of limiting the transient composite current amplification factor from being excessive. This latter function protects the circuit from being so sensitive as to be effected by inductive pick-ups. The inductor 26 does not effect the low level current amplification factor during steady state conditions as it is only effective during transients.

The circuit shown in FIG. 2 is triggered by an input pulse which is provided through the input terminal 30 and the coupling capacitor 31 to the terminal 21 of the combined three-terminal device. The terminal 21 is connected to a biasing arrangement which functions to normally maintain the emitter 13 negative with respect to the base 15. The varistor 33 functions to provide a low impedance path for emitter current and to shunt negative input pulses to ground, and the resistor 34 functions as part of a biasing circuit arrangement for the combined device. The biasing arrangement includes the minus 16-volt potential source 35 which is connected through the resistor 32, terminal 21, varistor 33, resistor 34 and the base resistor, or feedback promoting impedance, 25 to ground. The emiter 13 of transistor 10 is normally reverse biased with respect to the base 15 of transistor 10 due to the direct-current biasing arrangement through the varistor 33.

Before the monostable circuit is triggered, the output potential at terminal 39 is equal to minus 16 volts and the potential at terminal 21 is approximately minus 2.5 volts. The output terminal 39 is connected to the terminal 23 of the combined device which is also connected to the minus 16-volt potential source 38 through the resistor 37. When the circuit is triggered, the emitter potential decreases to forward bias the varistor 33 to allow the capacitor 36 to charge. The capacitor 36 charges through the varistor 33, the combined device and resistor 37 to the source 38. When the circuit is triggered, the load line effectively assumes the position of the dotted line B in FIG. 5. The line B is essentially horizontal because the varistor 33 and the capacitor initially present almost zero impedance to the emitter current. As the capacitor 36 charges, the current through the emitter 13 decreases exponentially with time until insufficient emitter current is supplied to maintain the combined device in a high current condition. As shown in FIG. 5, the load line effectively shifts from the dotted line B to line J as the capacitor charges. More specifically, the load line moves down as indicated by lines C, E and I. When the load line reaches line I, the current rapidly reduces and thereafter the potential increases until point G is reached. The potential at the capacitor 36 increases to minus 2.5 volts as determined by the biasing circuit arrangement, described above. In this manner, the current through the combined device is cut off rapidly, and the capacitor 36 discharges until the emitter potential assumes its original condition corresponding to point G in FIG. 5. The pulse duration is determined essentially by the capacitor 36, and the load connected to the output terminal 39, with the pulse duration decreasing with increasing load.

Except for the effect of the inductor 26 to reduce the turn-on interval, the pulse duration is determined by changes in the emitter circuit external to the combined device. It is the emitter load line which changes as the capacitor 36 charges and discharges, not the negative resistance characteristic. The circuit shown in FIG. 2 functions in exactly the same way for the combined device shown in FIG. 2 as for the combined device shown in FIG. 1 except for the improvement of turn-on sensitivity. The pulse duration is the same for both combined devices. The pulse duration is controlled, therefore, by changes in the load line whereas the negative resistance characteristic substantially remains the same.

As hereinafter described, when the pulse duration is controlled by the combined device instead of by an external component such as the capacitor 36, the load line remains substantially the same whereas the negative resistance characteristic changes to determine the pulse duration.

An illustrative embodiment of this invention includes the following circuit parameters for the components shown in FIG. 2:

| | |
|---|---|
| Transistor **10** | W.E. 1868, alpha=.99. |
| Transistor **11** | W.E. 1853, alpha=.99. |
| Rheostat **20** | Set at 15 ohms. |
| Resistor **25** | 2700 ohms. |
| Inductor **26** | 300 microhenries. |
| Rheostat **27** | Set at 60 ohms. |
| Resistor **28** | 500 ohms. |
| Capacitor **31** | .01 microfarad. |
| Resistor **32** | 20,000 ohms. |
| Resistor **34** | 1000 ohms. |
| Battery **35** | Minus 16 volts. |
| Capacitor **36** | .10 microfarad. |
| Resistor **37** | 2000 ohms. |
| Battery **38** | Minus 16 volts. |

For the above circuit parameters, the combined device has approximate current amplification factors of 1.03, 3 and 10, respectively, at the low current condition, high current condition and transient condition of the circuit. With the rheostats 19 and 20 set as indicated above, the dissipation in the transistors 10 and 11 is approximately one-fourth of the dissipation in transistors 10 and 11 when the rheostats 19 and 20 are not included in the circuit. In other words, the rheostats 19 and 20 function to materially reduce the dissipation in the transistors 10 and 11.

Figure 4:
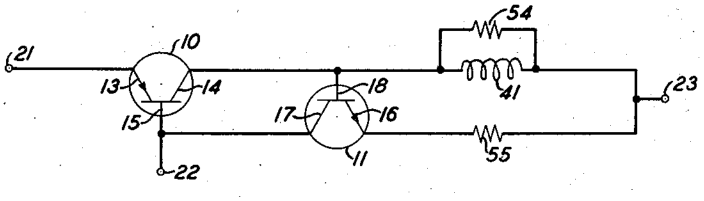
FIG. 4 is a circuit representation of another embodiment of the combined transistor device of this invention.

Referring now to FIGS. 3 and 4, monostability may be achieved utilizing a transient element in the combined device for the dual purpose of obtaining a high value of composite alpha upon reception of an input pulse and for causing the composite alpha to decay with time during the ensuing transients. As is hereinafter described, monostability is achieved by utilizing a transient element in the combined device (internal element) instead of external to the device (external element) with variations occurring in the negative resistance characteristic instead of in the emitter load line. In the combined device shown in FIG. 3 the transient element is a capacitor 40 and in the combined device shown in FIG. 4, the transient element is an inductor 41. Both devices may be utilized as the negative resistance element in the monostable circuit shown in FIG. 3. With either of the two combined devices, the monostable circuit is turned on or triggered upon reception of an input pulse and subsequently returns to its equilibrium condition when the composite alpha of the combined device has decreased to a value insufficient to sustain transistor saturation. An external transient element such as the capacitor 36 in FIG. 2 is not required as the combined device in itself functions to determine the pulse duration of the monstable circuit.

In FIG. 3, the combined device includes the capacitor 40 and a resistor 42 which are connected between the emitter 16 of transistor 11 and the terminal 23. The combined device also includes a resistor 43 which is connected between the base electrode 18 and terminal 23. The resistors 43 and 42 function to control the composite alpha in essentially the same manner as the rheostats 19 and 20, described above, in reference to the combined device shown in FIG. 1. As is hereinafter described, the resistor 42 is much larger than the resistor 43 to insure monostability as a very low steady state current amplification factor is provided thereby.

The input pulse is provided through the terminal 44 and the coupling capacitor 45 to terminal 21 of the combined device. Terminal 21 is connected to ground through the varistor 46 and through the resistor 47. Terminal 22 of the combined device is connected to the junction of resistors 48 and 49 which are serially connected between a plus 6-volt potential source 50 and ground. The resistors 48 and 49 function together as a feedback promoting element in the negative resistance arrangement. With a positive potential at the base electrode 15, the emitter-base junction of transistor 10 is normally reverse biased and the combined device is in a low current condition. Terminal 23 of the combined device is connected to the output terminal 51 and through the resistor 52 to the minus 16-volt potential source 53.

During steady state conditions, the composite alpha of the combined device shown in FIG. 3 is approximately equal to the alpha of transistor 10 and the total leakage current of the combined device is very small.

The capacitor 40 is normally in a discharged condition so that the transient impedance of the circuit arrangement connected to the emitter 16 initially is relatively low, and consequently the composite alpha becomes high, when an input pulse is received through terminal 44. Thereafter the capacitor 40 is charged by the emitter current through the transistor 11 to increase the effective impedance of the circuit arrangement connected to the emitter 16. As the impedance of the circuit arrangement connected to the emitter 16 increases, the composite alpha decreases. In this manner, the composite alpha of the combined device decreases with time after an input pulse has been received through terminal 44. When the monostable circuit returns to its quiescent condition the capacitor 40 discharges through the resistor 42, which in conjunction with capacitor 40 determines the recovery time. FIG. 7 illustrates the variations of the composite alpha when an input pulse is provided through terminal 21. The input pulse is provided to the combined device at time $t_1$.

Referring to FIG. 7 and to FIG. 6 which illustrate the variations in the input negative resistance characteristic of the combined device, the emitter load line L does not change during the operation of the circuit. When an input pulse is provided to the monostable circuit, the composite alpha of the combined device changes from a normal to a maximum value to turn on the monstable circuit. Relatively fast rise times of the order of 0.6 microsecond are obtained because of the very high composite alpha at the beginning of the transient. The resistor 43 is large with respect to the transient impedance of capacitor 40 to insure a high initial composite alpha. With maximum alpha, the negative resistance characteristic is the solid curve M. Transistor saturation is maintained as long as the composite alpha is high enough to maintain sufficient positive feedback but as the impedances change in the combined device and the composite alpha decays, the negative resistance characteristic collapses from curve M to the dotted curve N which is asymptotic to the load line L at point K. At point K, the composite alpha becomes too small to maintain sufficient positive feedback for transistor saturation. When this condition occurs the combined device turns off and the circuit returns to its equilibrium condition.

During the on condition both transistors 10 and 11 are saturated and the output is very nearly at ground potential. The output pulse amplitude is nearly equal to the maximum voltage swing available and the duration of the output pulse is determined by the capacitor 40. Constant load current is maintained since the termination of the output pulse is effected as a result of decreasing composite alpha rather than decreasing emitter current. As long as the composite alpha is large enough to maintain transistor saturation the load current is substantially constant. The output pulse is therefore very nearly flat topped or rectangular shaped.

The combined device shown in FIG. 4 provides for similar monostable operation because the composite alpha varies in a similar manner with time. The curve shown in FIG. 7 illustrates the operation of the monostable circuit with the inductive combined device (FIG. 4) as well as of the capacitive combined device (FIG. 3).

The inductive combined device includes the inductor 41 and a resistor 54 which are connected between the base electrode 18 and terminal 23. The emitter electrode 16 is connected to terminal 23 by a resistor 55. The resistors 54 and 55 and the resistors 43 and 42 as well in FIG. 3 may be made adjustable as are the rheostats 19 and 20 in FIG. 1. A resistor is not connected in series with the inductor 41 to provide for a minimum composite alpha during quiescent conditions. Almost all the collector currents of transistors 10 and 11 are shunted through the inductor 41 so that the composite alpha is essentially equal to the alpha of transistor 10.

Upon reception of an input pulse, the inductor 41 presents a very high impedance so that the composite alpha reaches a maximum value illustrated in FIG. 7. Thereafter, the transient impedance presented by the inductor 41 decays exponentially to reduce the composite alpha to a value insufficient to maintain transistor saturation. The composite alpha thereafter continues to decay due to the damping effect of resistor 54 until the steady state composite alpha is reattained. The negative resistance characteristic collapses, therefore, in much the same way as described above for the characteristic of the capacitive combined device and as illustrated in FIG. 6.

Illustrative embodiments of this invention include the following circuit parameters for the components shown in FIGS. 3 and 4:

| | |
|---|---|
| Transistor **10** | W.E. 1868, alpha=.99. |
| Transistor **11** | W.E. 1853, alpha=.99. |
| Capacitor **45** | .01 microfarad. |
| Resistor **47** | 5000 ohms. |
| Resistor **48** | 6200 ohms. |
| Resistor **49** | 6200 ohms. |
| Battery **50** | Plus 6 volts. |
| Resistor **43** | 200 ohms. |
| Resistor **42** | 2000 ohms. |
| Capacitor **40** | 0.1 microfarad. |
| Resistor **52** | 2000 ohms. |
| Battery **53** | Minus 16 volts. |
| Inductor **41** | 5 millihenries. |
| Resistor **54** | 1000 ohms. |
| Resistor **55** | 20 ohms. |

For the input components, the input sensitivity is approximately 3.5 volts at 25° C. and the duration of the output pulse is 25 microseconds with an external load of 500 ohms.

The present invention is, of course, not restricted to the above circuit parameters or particular circuit configuration as it is to be understood that the above-described arrangements are merely illustrative of the application of the principles of this invention. For example, the capacitive and the inductive combined devices may be utilized in a monostable circuit of the type shown in FIG. 2. With a capacitive or inductive combined device in the circuit shown in FIG. 2, both the load line and the characteristic vary and the pulse duration is controlled by both the external element (capacitor 36) and the internal element (capacitor 40 or inductor 41). Moreover, the capacitive combined device may be modified to include an inductor connected to the base electrode of transistor 11. The modified device would therefore have both a capacitive and an inductive internal element. It is evident, therefore, that numerous other arrangements may be devised by those skilled in the art without departing from the spirit and scope of the invention.

What is claimed is:

1. A signal translating device comprising a pair of transistors of opposite conductivity types, each of said transistors having a base, an emitter and a collector, means directly connecting the base of each of said transistors to the collector of the other of said transistors, a feedback promoting impedance connected between the base of one of said transistors and a reference level, a first terminal connected to the emitter of said one transistor, means for applying a bias to said first terminal, a second terminal, means for applying a bias to said second terminal, a first impedance connected between said second terminal and the base of the other of said transistors, and a second impedance including a capacitive circuit arrangement connected between said second terminal and the emitter of said other transistor.

2. A signal translating device in accordance with claim 1 wherein said capacitive circuit arrangement includes a capacitor connected to said emitter of said other transistor and a resistor connected across said capacitor.

3. A monostable circuit comprising a combined transistor device having a current amplification factor which varies with time, said device including a pair of transistors of opposite conductivity types, each of said transistors having a base, an emitter, and a collector, means directly connecting the base of each of said transistors to the collector of the other of said transistors, a first terminal connected to the emitter of one of said transistors, a capacitive arrangement connected to the emitter of the other of said transistors, a second terminal connected to said capacitive circuit arrangement, and a resistor connected between said second terminal and the base of said other transistor; a feedback promoting resistor connected between the base and the emitter of said one transistor; and biasing means comprising first bias means coupled between said base and said emitter of said one transistor, and second bias means connected to said second terminal, said biasing means being so disposed as to normally maintain said device in the low current conductive condition thereof.

4. A monostable circuit comprising a pair of transistors of opposite conductivity types, each of said transistors having a base, an emitter and a collector, means directly connecting the base of each of said transistors to the collector of the other of said transistors, feedback promoting impedance means connected between the base of one of said transistors and a reference level, means for applying an input signal to the emitter of said one transistor, an output terminal, impedance means connected between said output terminal and the base of the other of said transistors, impedance means connected between said output terminal and the emitter of said other transistor, biasing means comprising first means for biasing the emitter of said one transistor and second means for biasing the emitter of said other transistor, and capacitive impedance means connected between the emitter of at least one of said transistors and said reference level for controlling the duration of a signal at said output terminal in response to the application of an input signal to said circuit.

(References on following page)

References Cited in the file of this patent

UNITED STATES PATENTS

| | | |
|---|---|---|
| 2,585,078 | Barney | Feb. 12, 1952 |
| 2,655,608 | Valdes | Oct. 13, 1953 |
| 2,655,610 | Ebers | Oct. 13, 1953 |
| 2,744,198 | Raisbeck | May 1, 1956 |
| 2,770,732 | Chong | Nov. 13, 1956 |
| 2,787,712 | Priebe | Apr. 2, 1957 |
| 2,829,257 | Root | Apr. 1, 1958 |
| 2,831,113 | Weller | Apr. 15, 1958 |
| 2,831,128 | Sumner | Apr. 15, 1958 |
| 2,852,680 | Radcliffe | Sept. 16, 1958 |
| 2,890,353 | Van Overbeek | June 9, 1959 |
| 2,892,165 | Lindsay | June 23, 1959 |
| 2,958,789 | Lee | Nov. 1, 1960 |

FOREIGN PATENTS

| | | |
|---|---|---|
| 200,400 | Australia | Dec. 7, 1955 |